(12) United States Patent
Gandhi et al.

(10) Patent No.: US 11,302,674 B2
(45) Date of Patent: Apr. 12, 2022

(54) MODULAR STACKED SILICON PACKAGE ASSEMBLY

(71) Applicant: XILINX, INC., San Jose, CA (US)

(72) Inventors: Jaspreet Singh Gandhi, San Jose, CA (US); Suresh Ramalingam, Fremont, CA (US); William E. Allaire, West Chester, PA (US); Hong Shi, Fremont, CA (US); Kerry M. Pierce, Richland, WA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/880,811

(22) Filed: May 21, 2020

(65) Prior Publication Data

US 2021/0366873 A1 Nov. 25, 2021

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/08* (2013.01); *H01L 24/80* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2225/06517* (2013.01); *H01L 2225/06524* (2013.01); *H01L 2225/06548* (2013.01); *H01L 2225/06555* (2013.01); *H01L 2225/06586* (2013.01)

(58) Field of Classification Search
CPC ....... H01L 2224/32145; H01L 2224/80; H01L 2224/80896; H01L 2224/80895; H01L 25/50; H01L 25/0657; H01L 2225/06524; H01L 2225/06555; H01L 2225/06548; H01L 2225/06586; H01L 2225/06517; H01L 265/0657
See application file for complete search history.

(56) References Cited

U.S. PATENT DOCUMENTS

| | | |
|---|---|---|
| 9,190,297 B2 | 11/2015 | Choi |
| 9,418,966 B1 | 8/2016 | Kwon et al. |
| 2006/0226527 A1 | 10/2006 | Hatano et al. |
| 2011/0285006 A1 | 11/2011 | Weng et al. |
| 2013/0168854 A1 | 7/2013 | Karikalan et al. |
| 2014/0077391 A1 | 3/2014 | Kikuchi et al. |
| 2014/0079380 A1 | 3/2014 | Chiu et al. |
| 2014/0252632 A1 | 9/2014 | Barth et al. |
| 2014/0353827 A1 | 12/2014 | Liu |
| 2018/0096735 A1* | 4/2018 | Pappu ................... G11C 29/022 |
| 2019/0164936 A1 | 5/2019 | Agarwal et al. |
| 2021/0125967 A1* | 4/2021 | Zhai ........................ H01L 24/96 |

* cited by examiner

*Primary Examiner* — Jasmine J Clark
(74) *Attorney, Agent, or Firm* — Patterson + Sheridan, LLP

(57) ABSTRACT

A chip package assembly and method for fabricating the same are provided that provide a modular chip stack that can be matched with one or more chiplets. The use of chiplets enables the same modular stack to be utilized in a large number of different chip package assembly designs, resulting much faster development times at a fraction of the overall solution cost.

20 Claims, 13 Drawing Sheets

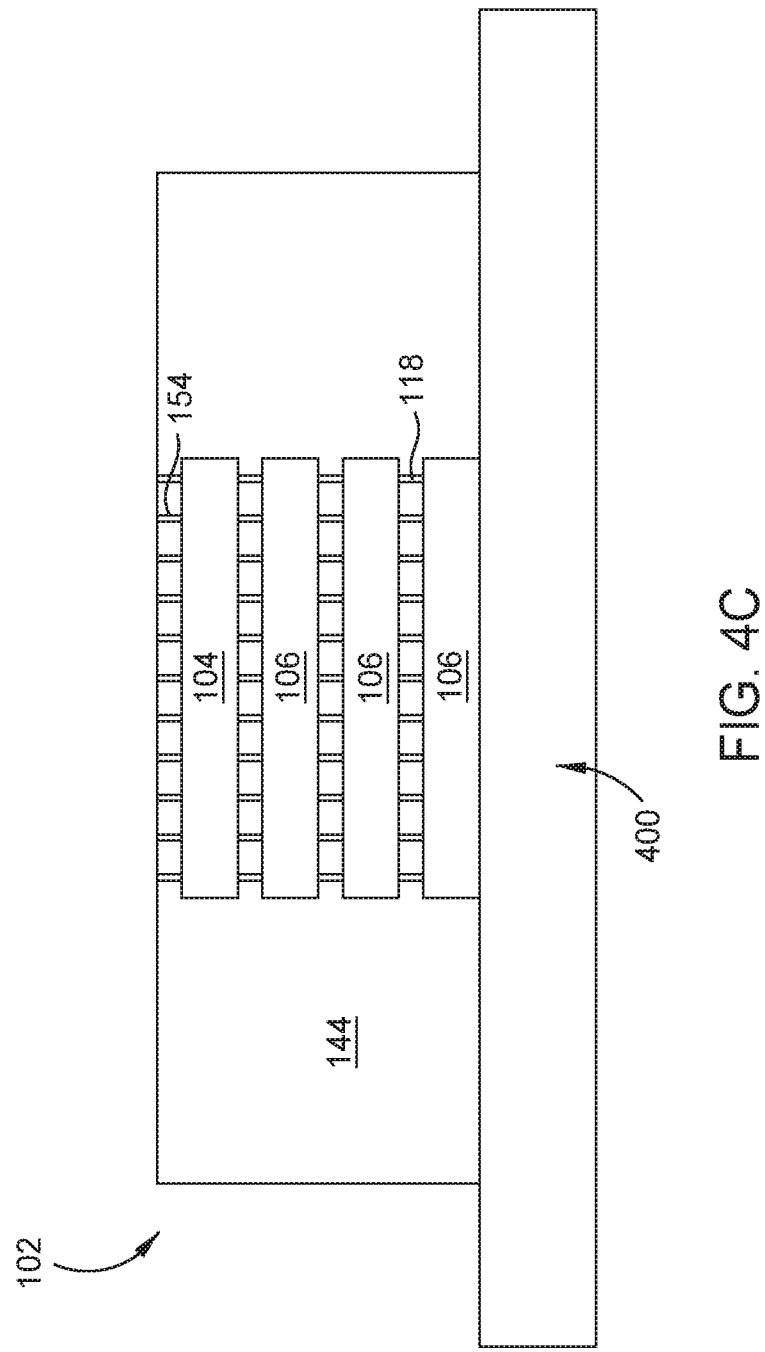

MODULAR STACKED SILICON PACKAGE ASSEMBLY

TECHNICAL FIELD

Embodiments of the present invention generally relate to a chip package assembly, and in particular, to a chip package assembly comprising a chiplet interfaced with one or more integrated circuit dies through a redistribution layer.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices.

To meet market needs in a timely fashion is particularly challenging due to the complexity of chip package designs. Packages employing large monolithic IC dies often require long design and built times, which consequently contribute to high costs. These attributes are not particularly desirable in markets that require short lead times for designs and low costs, such as in data center, artificial intelligence, and machine learning applications. Moreover, due to ever more rapidly changing application requirements, the ability to quickly and cost effectively satisfy evolving market demands has become extremely challenging.

Therefore, a need exists for chip package assemblies having improved modularity that enables shorter design and build lead times at reasonable costs as compared to conventional monolithic solutions.

SUMMARY

A chip package assembly and method for fabricating the same are provided that provide a modular chip stack that can be matched with a variety of separate chiplets. The use of a modular stack having a simple I/O interface allows the composition of the stack to be readily changed, while still being easily integrated with a wide variety of chiplet options, thus enabling a large number of different chip package assembly designs to be assembled from previously or more efficiently developed components, resulting much faster development times at a fraction of the cost.

In one example, a chip package assembly includes an input/output integrated circuit (I/O IC) die, a functional IC die, a first chiplet and a substrate. The I/O IC die has a first surface and a second surface. The functional IC die is stacked on the first surface of the I/O IC die. The substrate has a first surface and a second surface. The first chiplet is disposed between the substrate and the I/O IC die. The substrate has substrate circuitry commutatively coupled within the chip package assembly to functional circuitry of the functional IC die through the first chiplet and the I/O IC die.

In another example, a chip package assembly is provided that includes an input/output integrated circuit (I/O IC) die, a first redistribution layer (RDL), a first functional IC die, a first chiplet and a substrate. The IC I/O die has a first surface and a second surface. The functional IC dies are stacked on the first surface of the I/O IC die. The first RDL couples the second surface of the I/O IC die to the first chiplet. The substrate has a first surface and a second surface. The first chiplet is disposed between the substrate and the I/O IC die. The substrate has substrate circuitry commutatively coupled within the chip package assembly to functional circuitry of the functional IC dies through the first RDL, the first chiplet and the I/O IC die. The first RDL has circuitry directly connecting I/O circuitry of the I/O IC die to the substrate circuitry while bypassing the first chiplet. A dielectric filler layer is disposed laterally around the I/O IC die and the functional IC dies.

In yet another embodiment, a method for fabricating a chip package assembly is provided that includes (a) forming a die stack including a plurality of integrated circuit (IC) dies and an I/O IC die, the I/O IC die having exposed contacts; (b) forming a first redistribution layer (RDL) on the exposed contacts of the I/O IC die; (c) coupling a chiplet to the first RDL; and (d) coupling the chiplet to a substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4F are schematic sectional views of a chip package assembly at different stages of the method of FIG. 4.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided that includes a modular chip stack that can be matched with one or more chiplets. The use of one or more chiplets with a scalable modular chip stack enables a large number of different chip package assembly designs to be efficiently brought to market, resulting much faster development times at a fraction of the cost. The modularity of the chip package assembly is enabled by utilizing a simple input/output integrated circuitry (I/O IC) die at the bottom of the chip stack. A redistribution layer (RDL) is utilized to couple the I/O IC die of the chip stack to one or more chiplets. Thus, I/O IC die enables the use of just about any combination of functional (i.e., memory or logic) I/C dies within the chip stack, which retaining the same connection footprint with the RDL. The flexibility of RDL fabrication enables various chiplets to be utilized with a single I/O IC die design. Consequently, the I/O IC die/RDL interface allow many different combinations of functional IC dies to be matched with many different chiplets without having to design and tapeout the entire chip package assembly for every new application.

In the examples described below, a chip package assembly includes a chip stack that is interconnected with a chiplet utilizing a redistribution layer (RDL). The chip stack can be provided as a unitary subcomponent of the chip package assembly that may be beneficially utilized in other chip package assemblies. Moreover, the chip stack and RDL combined as a chip stack/RDL assembly may also be provide as a unitary subcomponent of the chip package assembly that may be beneficially utilized in other chip package assemblies using a variety of chiplets. In some examples, at least one chiplet is embedded in a chiplet layer having conductive signal feed throughs for efficient ground and power routing. The chiplet layer is configured to directly connect to the chip stack/RDL assembly to provide a modular assembly techniques with enable the use of different chip stacks and/or chiplet(s) without significant development and design costs between configurations.

Beneficially, the configuration and techniques described above and further detailed below provide a modular and scalable chip package assembly. Consequently, the cost and development time to create a chip package assembly is significantly improved as compared to conventional large monolithic die solutions.

Figure 1:
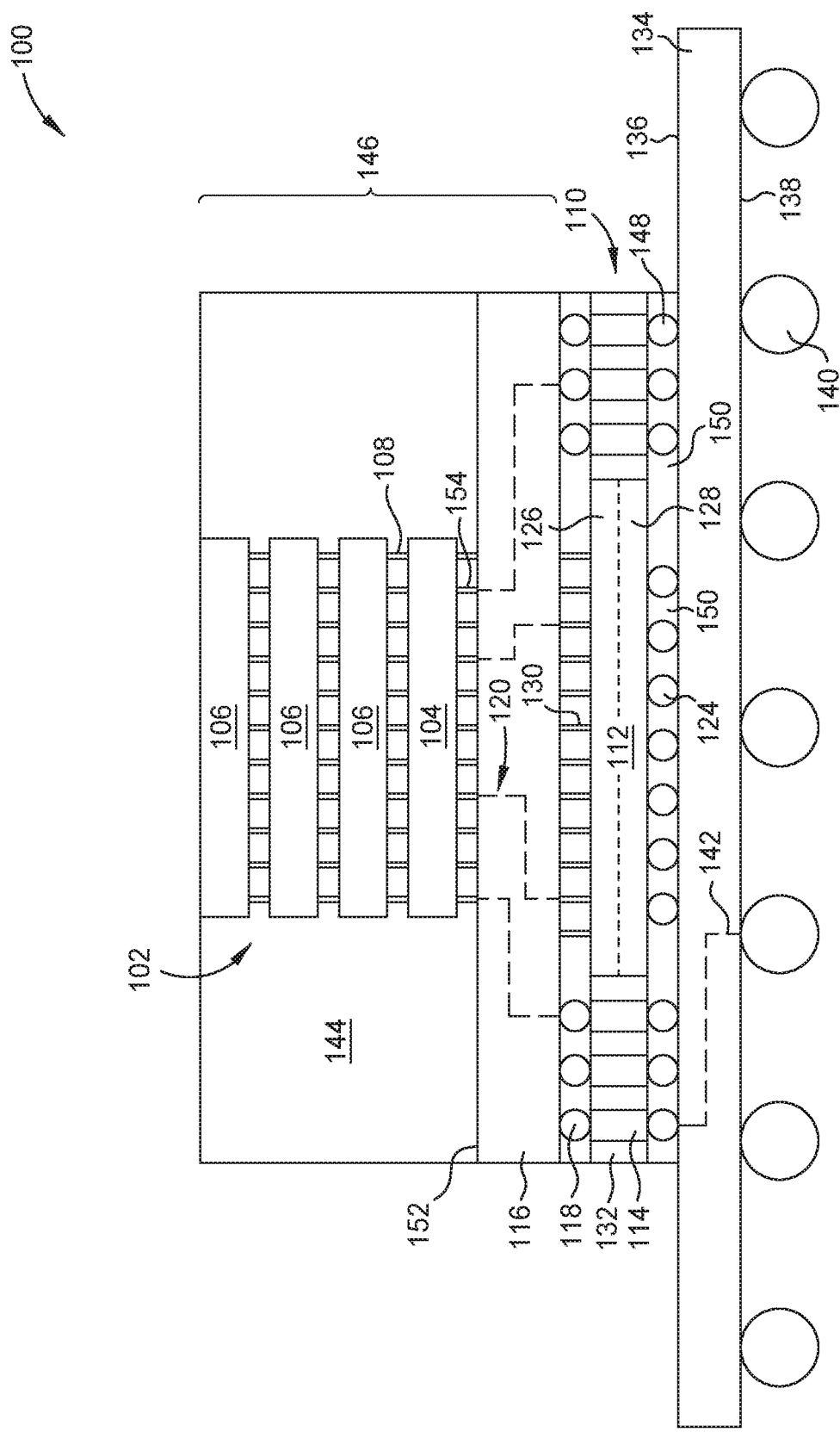
FIG. 1 is a schematic sectional view of a chip package assembly having a chiplet coupled to a chip stack by a redistribution layer of the chip package assembly.

Turning now to FIG. 1, a schematic sectional view of a chip package assembly 100 is illustrated. The chip package assembly 100 includes a chip stack 102 coupled to a chiplet 112 by a redistribution layer (RDL) 116. The chip package assembly 100 also includes a package substrate 134. The chiplet 112 is disposed in a chiplet layer 110, which also includes a plurality of conductive signal feed throughs 114. Circuitry 120 of the RDL 116 is configured to connect package substrate circuitry 142 of the package substrate 134 and circuitry of the chiplet 112 with circuitry of the chip stack 102 within the confines of the chip package assembly 100.

The chip stack 102 is embedded in mold compound 144. The chip stack 102 and mold compound 144, along with the RDL 116, form a chip stack/RDL assembly 146. The chip stack/RDL assembly 146 is mechanically and electrically connected directly with the chiplet layer 110, and through the chiplet layer 110 to the package substrate 134.

The chip stack 102 includes a least one input/output integrated circuit (I/O IC) die 104 and at least one functional IC die 106. Although three functional IC dies 106 are shown vertically stacked on top of the I/O IC die 104 in FIG. 1, the total number of functional IC dies 106 may range from one to as many as can be fit within the chip package assembly 100. Additionally, although a single IC chip stack 102 is illustrated in FIG. 1, additional IC chip stacks may be laterally disposed on a common package substrate 134, connected to the common package substrate 134 by one or more chiplet layers 110 via a common or separate RDL 116.

The I/O IC die 104 generally includes routing circuitry for coupling the circuitry 120 of the RDL 116 to the circuitry of the functional IC dies 106 within the IC chip stack 102. The I/O IC die 104 is a simple silicon device that enables data to be moved between multiple complex silicon devices, that is, the functional IC dies 106. The I/O IC die 104 includes control inputs which select/enable data to be input from the one or more complex silicon devices (e.g., the functional IC dies 106) and then distributed to one or more complex silicon devices in a flexible manner. The I/O IC die 104 is distinct from the functional IC dies 106 that the circuitry of the I/O IC die 104 connects as the I/O IC die circuitry performs little to no processing of the data being transferred between functional IC dies 106 or between the functional IC dies 106 and the circuitry 120 of the RDL 116. As such, the circuitry of the I/O IC die 104 is many orders of magnitude less complex than the functional IC dies 106.

In one example, the circuitry of the I/O IC die 104 includes only routing circuitry. In another example, the circuitry of the I/O IC die 104 includes mux and demux circuitry. The circuitry of the I/O IC die 104 may additionally include clocking circuitry. Simple route processing circuitry may be present in the circuitry of the I/O IC die 104 to the extent needed to route signals through the I/O IC die 104 between the functional IC dies 106, and between the circuitry of the functional IC dies 106 and circuitry 120 of the RDL 116.

As stated above, one or more functional IC dies 106 are stacked on the I/O IC die 104. One or more of the functional IC dies 106 utilized in the chip stack 102 include, but are not limited to, programmable logic devices, such as field programmable gate arrays (FPGA), memory devices, such as high band-width memory (HBM), optical devices, processors or other IC logic structures. One or more of the functional IC dies 106 may optionally include optical devices such as photo-detectors, lasers, optical sources, and the like. In the example of FIG. 1, the functional IC die 106 furthest from the I/O IC die 104 is a logic die having math processor (also known as math engine) circuitry for accelerating machine-learning math operations in hardware, such as self-driving cars, artificial intelligence and data-center neural-network applications. In one example, the functional IC dies 106 in the stack 102 include block random access memory (BRAM), UltraRAM (URAM), digital signal processing (DSP) blocks, configurable logic elements (CLEs), and the like. It is contemplated that the functional IC dies 106 comprising the chip stack 102 may be the same or different types, including types other than FPGA dies.

Mold compound 144 is disposed on the outside of the functional IC dies 104, 106 and provides additional rigidity to the package assembly 100, while also protecting the interconnects 108 between the functional IC dies 104, 106. The mold compound 144 may be polymeric material, such as an epoxy-based material or other suitable material.

Each functional IC die 106 includes a bottom surface and a top surface. The bottom surface of the functional IC die 106 is coupled to the top surface of the next lower functional IC die 106 within the IC chip stack 102. The bottom surface of the bottom-most functional IC die 106 within the IC chip stack 102 is coupled to a top surface of the I/O IC die 104. The functional IC dies 106 and I/O IC die 104 are mechanically and electrically coupled to each other through interconnects 108, which may be either solderless hybrid bonding and/or solder connections.

A bottom surface of the I/O IC die 104 is coupled to a top surface of the RDL 116. The circuitry of the I/O IC die 104 is mechanically and electrically coupled to circuitry 120 of the RDL 116 through interconnects 108, such as either solderless hybrid bonding or via solder connections. A bottom surface of the RDL 116 is coupled to a top surface of the chiplet layer 110 through interconnects 130, which may be either solderless hybrid bonding and/or solder connections.

As discussed above, the chiplet layer 110 includes conductive signal feed throughs 114 and the chiplet 112. The conductive signal feed throughs 114 and the chiplet 112 are embedded in a mold compound 132. The conductive signal feed throughs 114 generally are conductive routings that pass between the top and bottom surfaces of the chiplet layer 110. The mold compound 132 is a dielectric filler layer that provide electrical insulation between the feed throughs 114 and provides rigidity to the chiplet layer 110.

The chiplet 112 is an integrated circuit block configured to work the chip stack 102 or other chiplets disposed within the chip package assembly 100. The chiplet 112 contains circuitry comprised of one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, and power regulation/distribution system, or an optical to electrical converter, among others. The chiplet 112 may also be configured as or part of a high band-width memory (HBM) device. A top surface of the chiplet 112 is coupled to the bottom surface of the RDL 116 through interconnects 130, while a bottom surface of the chiplet 112 is coupled to the top surface 136 of the package substrate 134 via dummy balls 124. Alternatively in embodiments where the chiplet 112 includes TSVs, the balls 124 may be active to connect the circuitry of the chiplet 112 and/or RDL 116 to the circuitry 142 of the package substrate 134. The dummy balls 124 provide good uniform spacing surface for the chiplet 112 from the top surface 136 of the package substrate 134 so that solder interconnects 148 coupling the feed throughs 114 to the package substrate circuitry 142 of the package substrate 134 have reduced stress when exposed through a wide temperature range. The spacing provided by the dummy balls 124 also allows underfill 150 to be disposed between the package substrate 134 and chiplet layer 110 to protect the solder interconnects 148 and dummy balls 124, while increasing the rigidity of the chip package assembly 100.

The chiplet 112 may optionally include through silicon vias to allow power, ground and/or data signals to pass straight through the chiplet 112. In the example depicted in FIG. 1, the chiplet 112 does not have through silicon vias, as all inputs and outputs of the chiplet 112 are routed through the active surface 126 via the interconnects 130, while all power, ground and/or data signals are routed though the signal feed throughs 114 directly between the circuitry 120 of the RDL 116 and the package substrate circuitry 142 of the package substrate 134.

A bottom surface 138 of package substrate 134 is coupled to a printed circuit board (PCB, not shown), by solder balls 140 or other suitable electrical connection. The solder balls 140 provide electrical signals, such as data, ground and power, through the package substrate circuitry 142 of the package substrate 134, to the chiplet layer 110, and ultimately to the circuitry of the functional IC dies 106 through the circuitry 120 of the RDL 116 and circuitry of the I/O IC die 104.

As discussed above, circuitry of the I/O IC die 104 is connected to circuitry 120 of the RDL 116. Details of the connection between the I/O IC die 104 and the RDL 116 are further provided in FIG. 2. The RDL 116 is also in contact with a bottom surface 152 of the mold compound 144.

Figure 2:
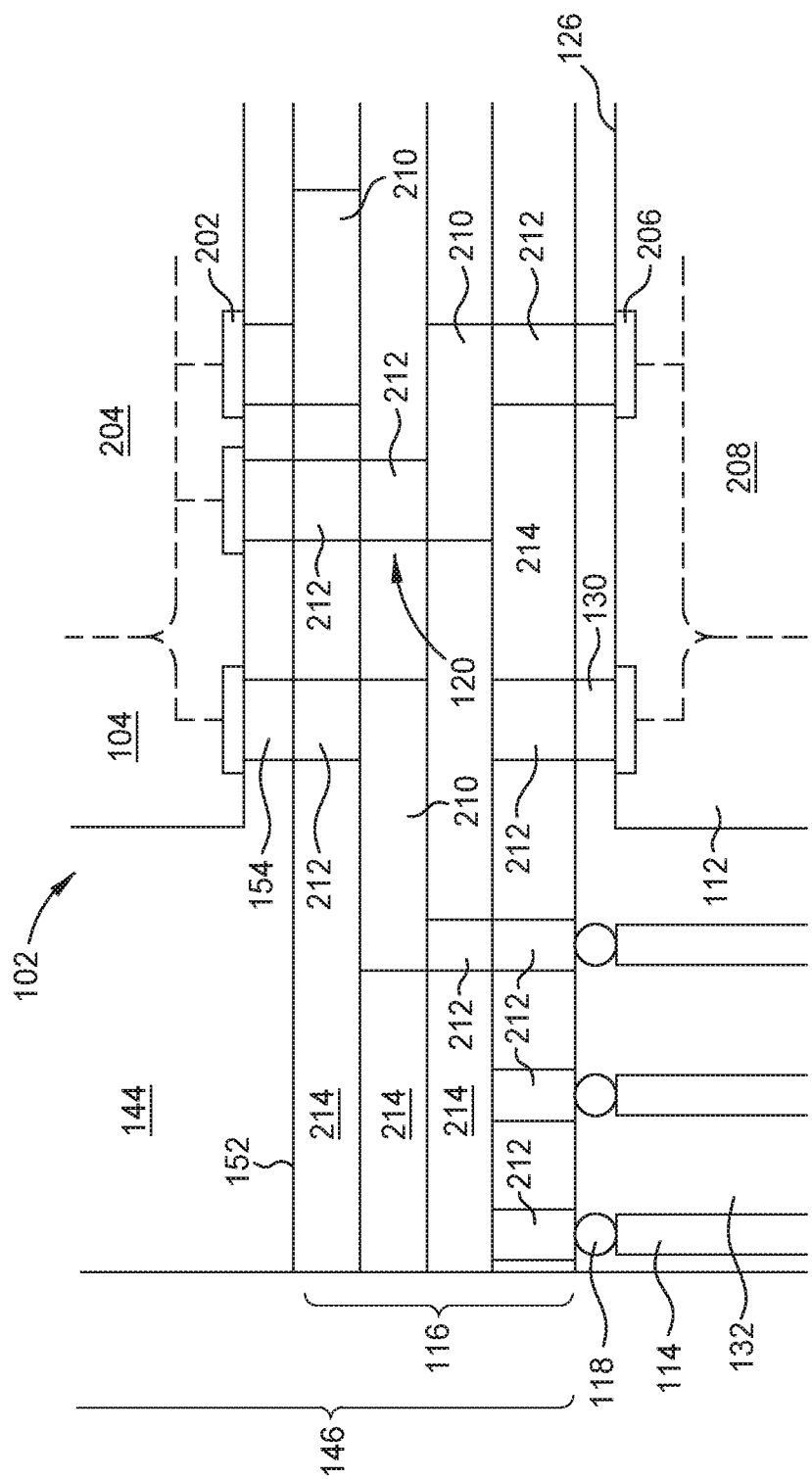
FIG. 2 is a partial sectional view of the chip package assembly of FIG. 1 illustrating a portion of the redistribution layer of the chip package assembly.

Referring to the partial sectional view of FIG. 2, the I/O IC die 104 includes contact pads 202 at which circuitry 204 of the I/O IC die 104 terminates. The contact pads 202 are exposed to the bottom surface of the I/O IC die 104. The interconnects 154 are formed on the pads 202. The interconnects 154 are also electrically and mechanically connected to the circuitry 120 of the RDL 116. The top surface of the RDL 116 is fabricated directly on the bottom surface of the I/O IC die 104 and bottom surface 152 of the mold compound 144. Alternatively, the RDL 116 may be formed on the surface of the chiplet 112. The RDL 116 includes at least 3 layers of metal and dielectrics that are patterned to produce the circuitry 120 of the RDL 116. In one example, routings comprising the circuitry 120, formed by the patterned metal lines 210 and vias 212, within dielectric layers 214, are directly connected to the interconnects 154 exposed below the bottom of the I/O IC die 104 without solder connections. In this manner, the spacing between the contact pads 202 may have a much finer pitch than connections utilizing solder interconnects. The routings comprising the circuitry 120 terminate and are exposed to the bottom surface of the RDL 116 to facilitate electrical and mechanical connection with the circuitry of the below chiplet 112 and conductive signal feed throughs 114. For example, the circuitry 120 of the RDL 116 is connected via the interconnects 130 to contact pads 206 exposed on the active surface 126 of the chiplet 112. The circuitry 120 of the RDL 116 is also connected via the interconnects 118 to the conductive signal feed throughs 114.

Figure 3:
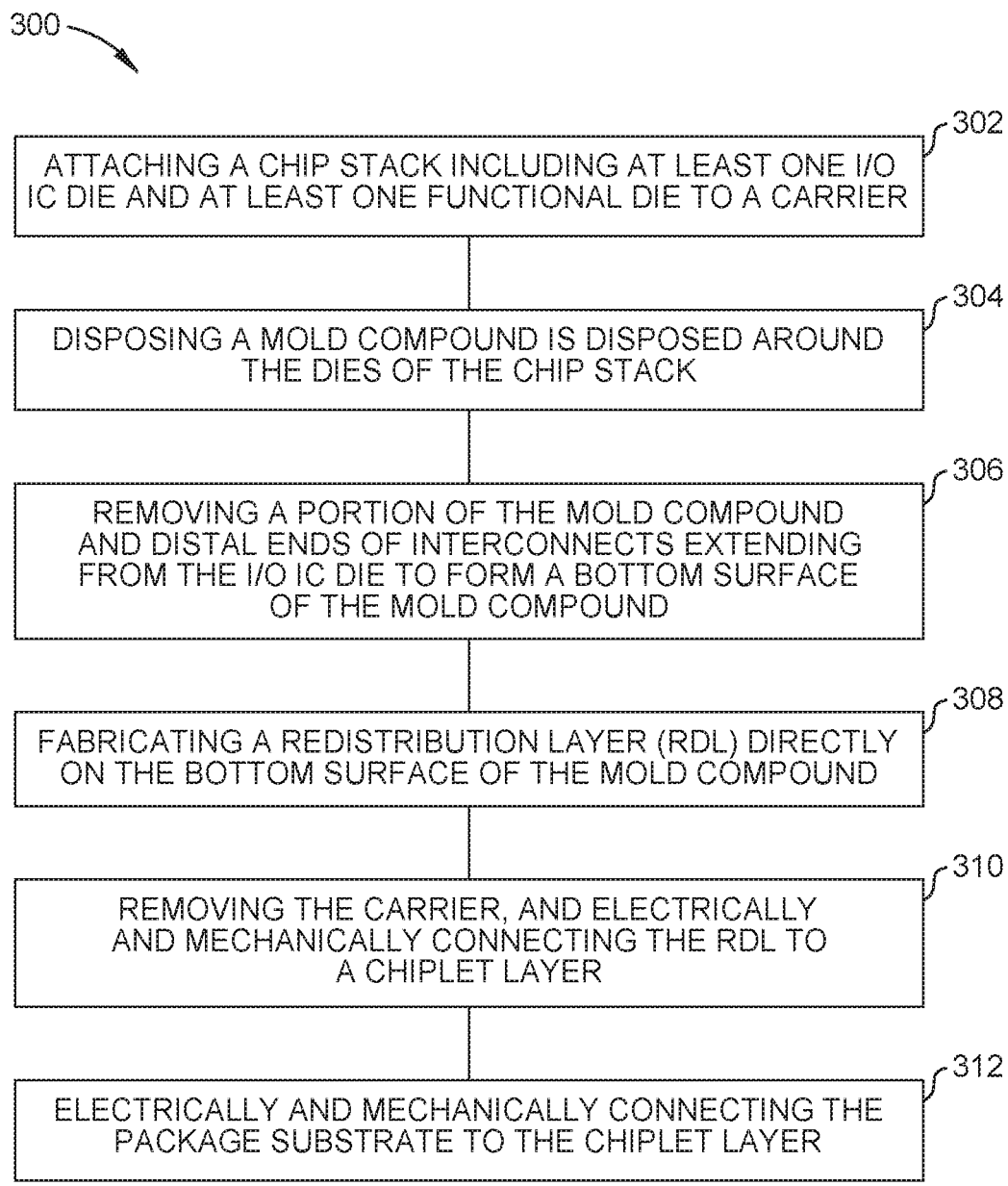
FIG. 3 is a flow diagram of a method for fabricating a chip package assembly having a chiplet coupled to a chip stack by a redistribution layer of the chip package assembly.

FIG. 3 is a flow diagram of a method 300 for fabricating a chip package assembly having a chip stack coupled to a chiplet via an RDL, such as the chip package assembly 100 described above with reference to FIGS. 1-2, among others. FIGS. 4A-4F are schematic sectional views of a chip package assembly 100 at different stages of the method 300 of FIG. 3. It should be noted that the orientation of the dies 104, 106 and other components illustrated in FIGS. 4A-4E is different by 180 degrees as compared to as shown in FIG. 1. Stated differently, the dies 104, 106 and other components illustrated FIGS. 4A-4E are upside down as compared to as shown in FIG. 1.

Figure 4A:
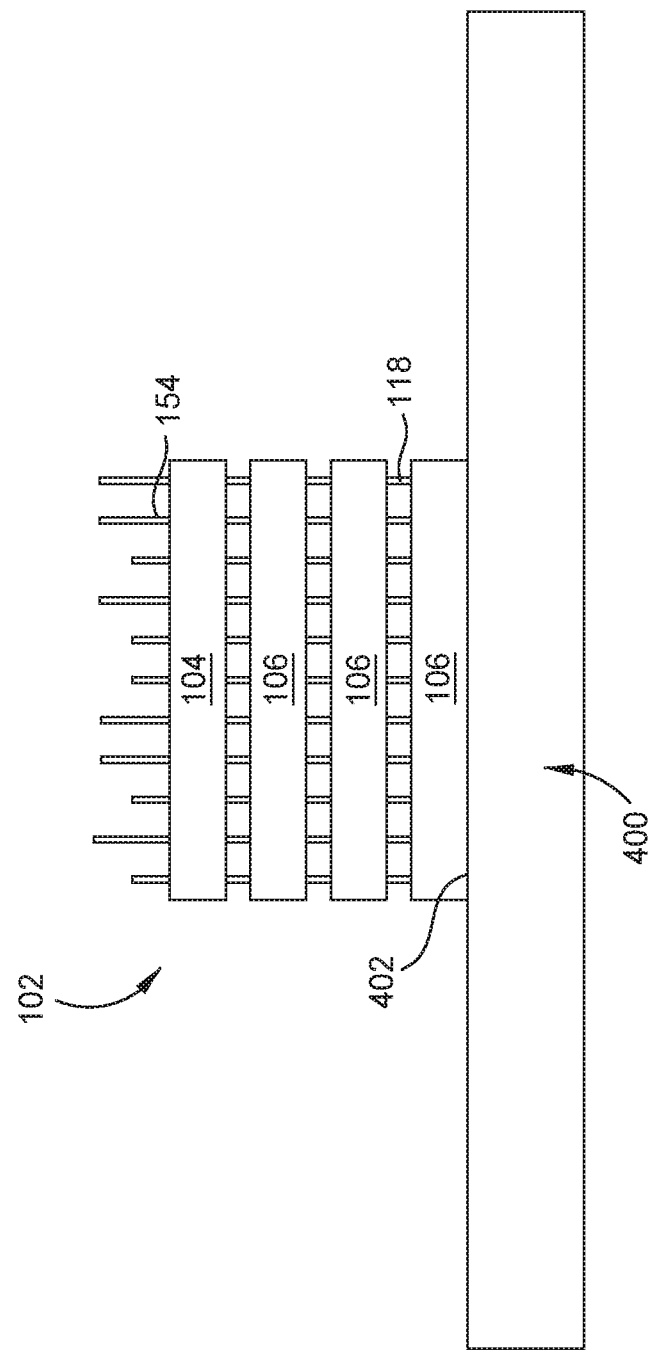

The method 300 begins at operation 302 by attaching a chip stack 102 including at least one I/O IC die 104 and at least one functional die 106 to a carrier 400, as illustrated in FIG. 4A. The carrier 400 is utilized only during the initial fabrication operations, and as such is removably attached the chip stack 102 prior to mounting the chip stack 102 and later fabricated RDL 116 to a substrate, such as the package substrate 134, and completing the fabrication of the chip package assembly 100. In one example, a top surface 402 of the chip stack 102 is attached to the carrier 400 using releasable pressure sensitive adhesive.

The interconnects 154 are illustrated extending from the surface of the I/O IC die 104, that is, the surface of the upper most functional IC die 106 that is facing away from the adjacent functional IC die 106. The interconnects 154 may be fabricated by patterning and plating, or via another technique. The interconnects 154 may alternatively be formed at a later stage of the method 300.

Figure 4B:
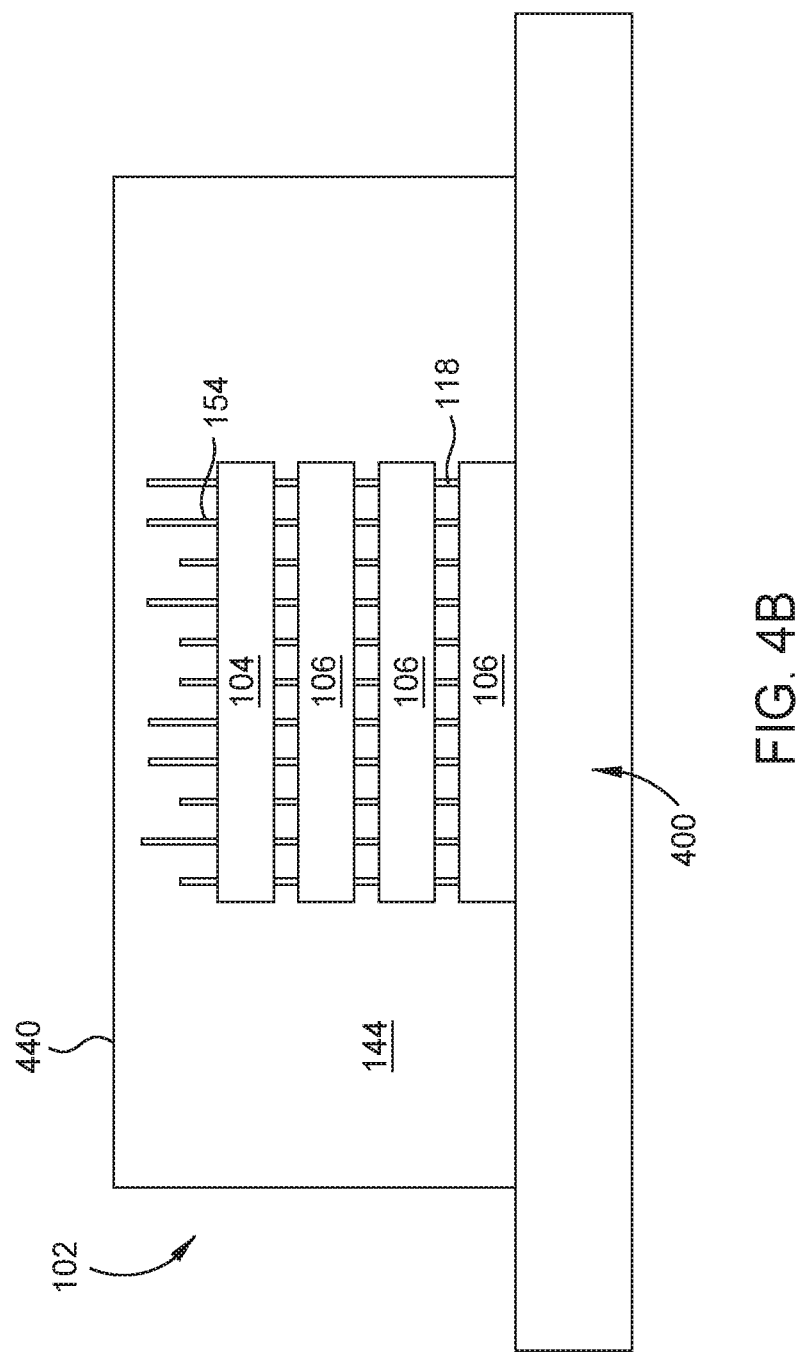

At operation 304, mold compound 144 is disposed around the dies 104, 106 and in contact with the carrier 400, as illustrated in FIG. 4B. The mold compound 144 extends beyond the bottom surface of the I/O IC die 104 to an initial surface 440. The interconnects 154 are generally below the initial surface 440 and encapsulated by the mold compound 144. The mold compound 144 may be spin on, dispensed, over molded or deposited by another suitable method. At operation 304, the mold compound 144 fills the interstitial space defined between adjacent dies 104, 106.

Optionally at operation 304, at least one or more auxiliary elements may be embedded in the mold compound 144 adjacent to the chip stack 102. The auxiliary element embedded in the mold compound may be a dummy die, a capacitor, an inductor, or a chiplet. In some examples, multiple auxiliary elements are embedded in the mold compound 144 adjacent to the chip stack 102. When multiple auxiliary elements are embedded in the mold compound 144, each auxiliary element may be the same type of auxiliary element, or alternatively, one or more of the auxiliary elements may be different types of auxiliary elements.

Alternatively, the auxiliary elements when utilized may be later coupled to the RDL 116 after the mold compound 114 has been deposited. That is, the auxiliary elements may not be embedded within the mold compound 114 and later coupled to the RDL 116.

At operation 306, the initial surface 440 of the mold compound 144 and the distal ends of the interconnects 154 are ground, mechanically or otherwise removed to form the bottom surface 152 of the mold compound 144, as illustrated in FIG. 4C. Operation 306 makes the distal ends of the interconnects 154 coplanar with the bottom surface 152 of the mold compound 144.

Figure 4D:
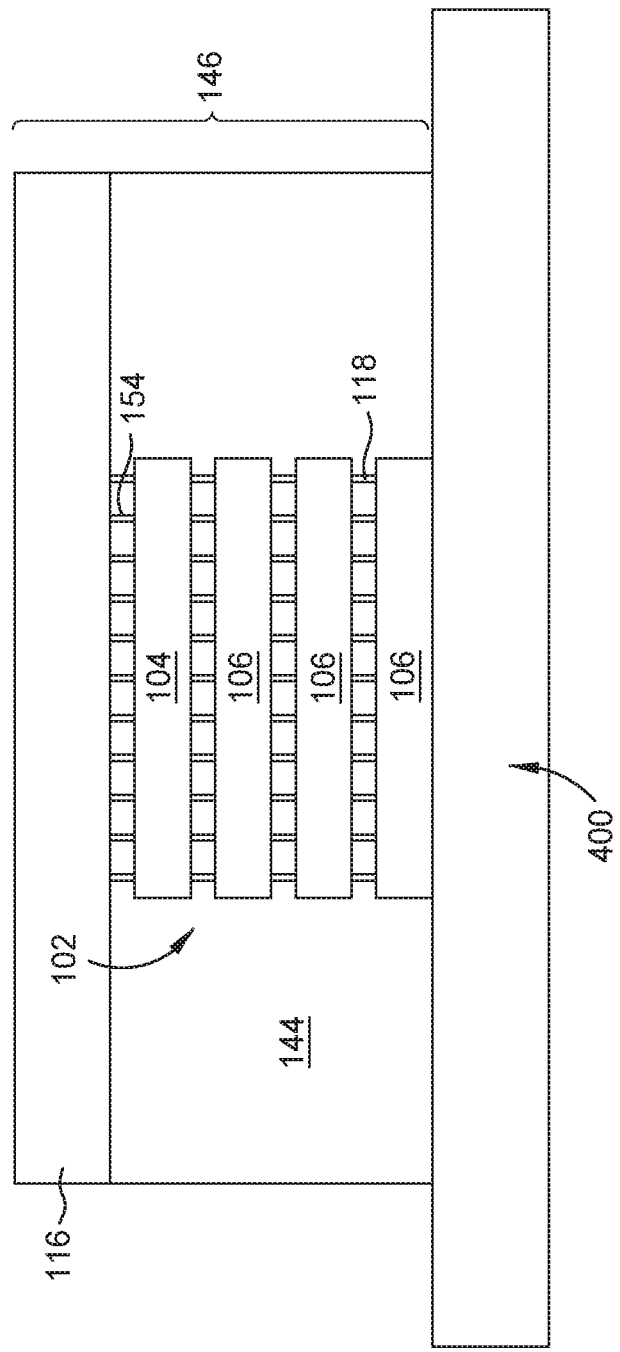

At operation 308, the RDL 116 is fabricated directly on the bottom surface 152 of the mold compound 144 without use of solder connections, as shown in FIG. 4D. The RDL 116 is fabricated by depositing at least 3 or more dielectric layers 214 in which metal routings, formed from lines 210 and vias 214, are formed. The metal lines 210 and vias 212 of the metal routings form the circuitry 120 of the redistribution layer 116.

Figure 4E:
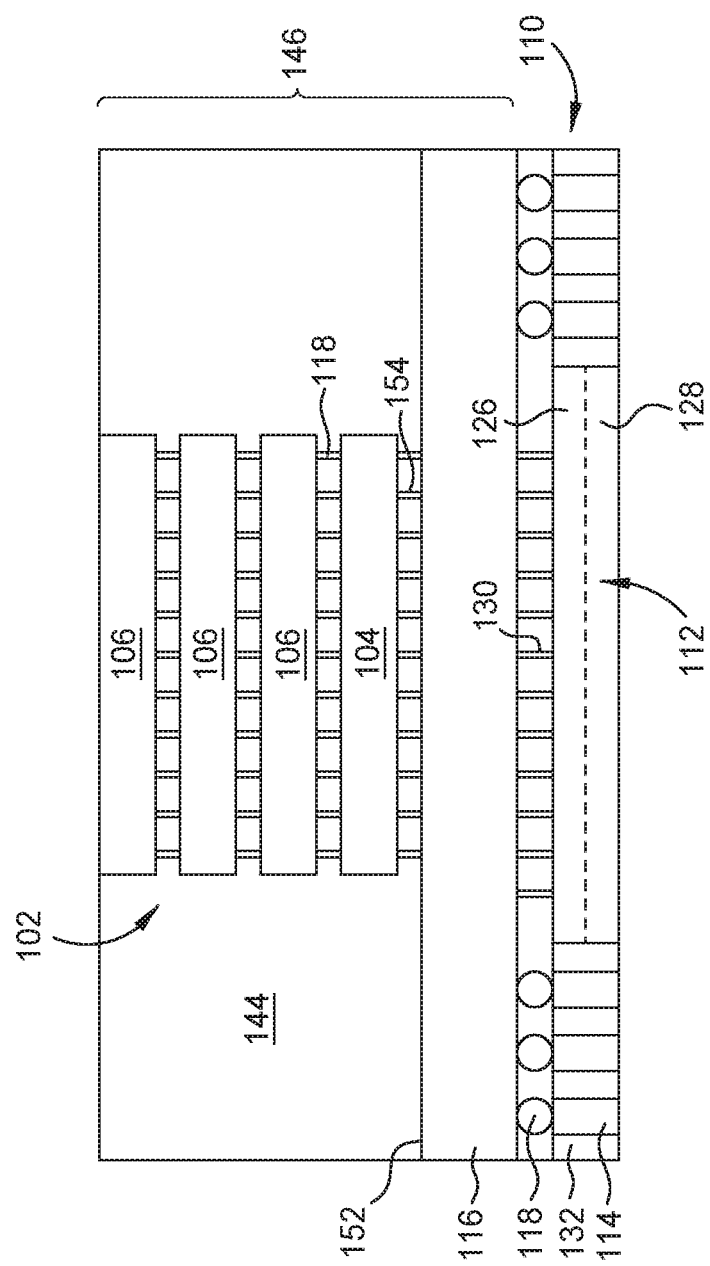

At operation 310, the carrier 400 is removed and the RDL 116 is electrically and mechanically connected to the chiplet layer 110 utilizing interconnects 118, 130, as shown in FIG. 4E. The chiplet layer 110 may be oriented such that the active surface 126 of the chiplet 112 is disposed against and electrically connected to the RDL 116. Alternatively, the chiplet layer 110 may be oriented such that the silicon surface 128 of the chiplet 112 is disposed against the RDL 116, such that the circuitry 120 of the RDL 116 is coupled to through silicon vias exposed on the surface of the chiplet 112.

Figure 4F:
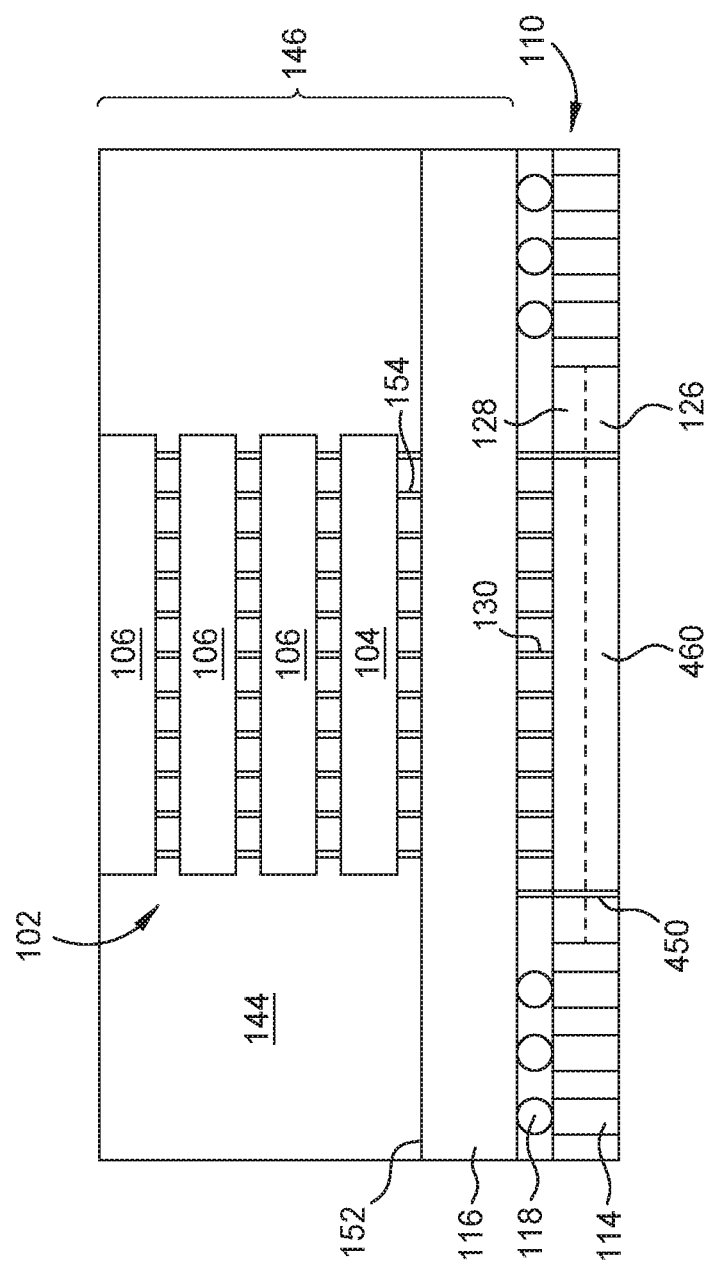

At operation 312, the package substrate 134 is electrically and mechanically connected to the chiplet layer 110 utilizing interconnects utilizing solder interconnects 148, as illustrated in FIG. 4E. In the example of in FIG. 4E, the active surface 126 of the chiplet 112 is facing the RDL 116 so that the electrical connection between the conductive signal feed throughs 114 of the chiplet layer 110 and the package substrate circuitry 142 of the package substrate 134 is provided by solder interconnects 148 or other suitable connection, while the circuitry of the chiplet 112 is mechanically and electrically coupled to the circuitry 120 of the RDL 116 by interconnects 130 or other suitable connection. Alternatively and as shown in FIG. 4F, the active surface 126 of the chiplet 112 is facing away from the RDL 116, such that interconnect 130 are utilized to couple the circuitry 120 of the RDL 116 to through silicon vias 450 formed through the chiplet 112, while solder interconnects 148 are utilized to connect the conductive signal feed throughs 114 of the chiplet layer 110 to the circuitry 120 of the RDL 116.

At operation 312, the package substrate 134 is coupled to the chiplet layer 110 by interconnects 148, as shown in FIG. 1 having the active surface 126 of the chiplet 112 facing the RDL 116. Operation 312 may also include coupling the package substrate 134 to the chiplet layer 110 by dummy (or functional) balls 124. In examples where the chiplet 112 includes through silicon vias, the vias may be electrically and mechanically coupled to the package substrate circuitry 142 of the package substrate 134 by solder interconnects 148 or other suitable connection.

Alternatively, the RDL 116 may be fabricated on the chiplet layer 110, then subsequently attached to the chip stack 102 utilizing solder or other connections.

Figure 5:
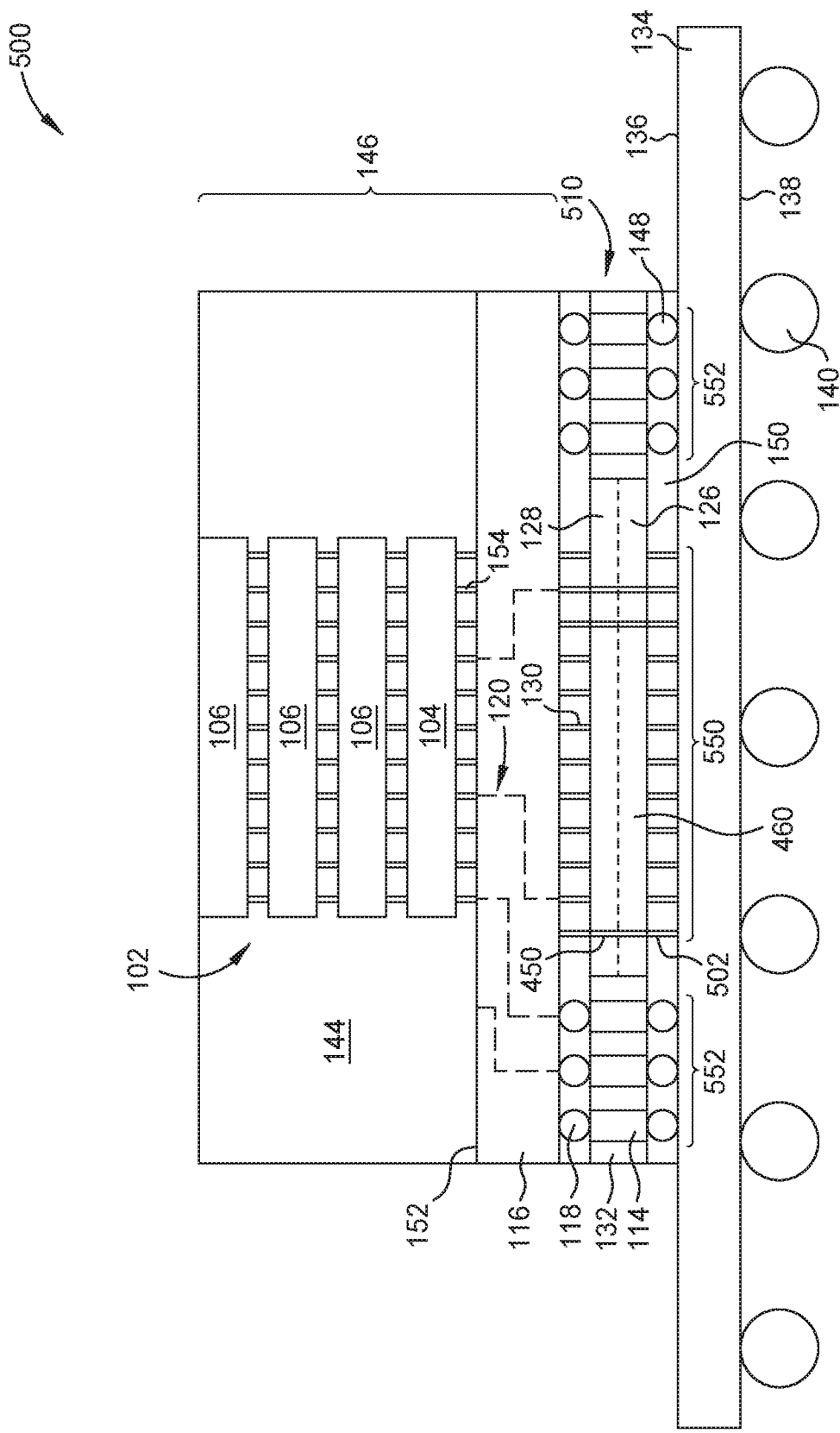
FIG. 5 is a schematic sectional view of another chip package assembly having a chiplet coupled to a chip stack by a redistribution layer of the chip package assembly.

FIG. 5 depicts a schematic sectional view of a chip package assembly 500 having a chip stack 102 coupled to a chiplet 460 by a redistribution layer (RDL) 116. The chip stack 102 and the redistribution layer RDL 116 are configured as described above, forming a chip stack/RDL assembly 146. The chip stack/RDL assembly 146 is mounted to a chiplet layer 510, that includes the chiplet 460.

The chiplet layer 510 is configured essentially the same as the chiplet layer 110, except wherein the chiplet 460 disposed in the chiplet layer 510 has an active surface 126 facing a package substrate 134 to which the chiplet layer 510 is mounted. A silicon surface 128 of the chiplet 460 faces and is coupled to the RDL 116.

More specifically, the chiplet 460 is configured essentially the same as the chiplet 112, except wherein the chiplet 460 includes a plurality of through silicon vias 450. The through silicon vias 450 are coupled on the silicon surface 128 of the chiplet 460 to the circuitry (142, not shown in FIG. 5) of the package substrate 134 by interconnects 502, which may be either solderless hybrid bonding and/or solder connections. The through silicon vias 450 are coupled on the active surface 126 of the chiplet 460 to the circuitry 120 of the RDL 116 by interconnects 130, which may be either solderless hybrid bonding and/or solder connections. In the example depicted in FIG. 5, at least some of the plurality of through silicon vias 450 are configured to transmit power and/or ground signals between the RDL 116 and the package substrate 134.

As the interconnects 502 may be much more closely spaced than the interconnects 148, package substrate circuitry 142 in a portion 550 of the package substrate 134 to which the interconnects 502 connects to the chiplet 460 has a much finer pitch as compared to circuitry in portions 552 of the package substrate 134 to which the interconnects 148 connect to the feed throughs 114.

For example, as the active surface 126 of the chiplet 460 is mounted to the package substrate 134, the pitch of the contact pads of the package substrate 134 in the portion 550 and the pitch of the contact pads 206 of the chiplet 460 can be 130 μm or less, such as 54 μm or less, thus facilitating high density signal transmission. The pitch of the contact pads in the portions 552 of the package substrate 134 and the pitch of the conductive signal feed throughs 114 of the chiplet layer 510 are greater than 200 μm, thus allowing more cost effective fabrication in the regions of the chiplet layer 510 surrounding (i.e., outward of) the chiplet 460.

Figure 6:
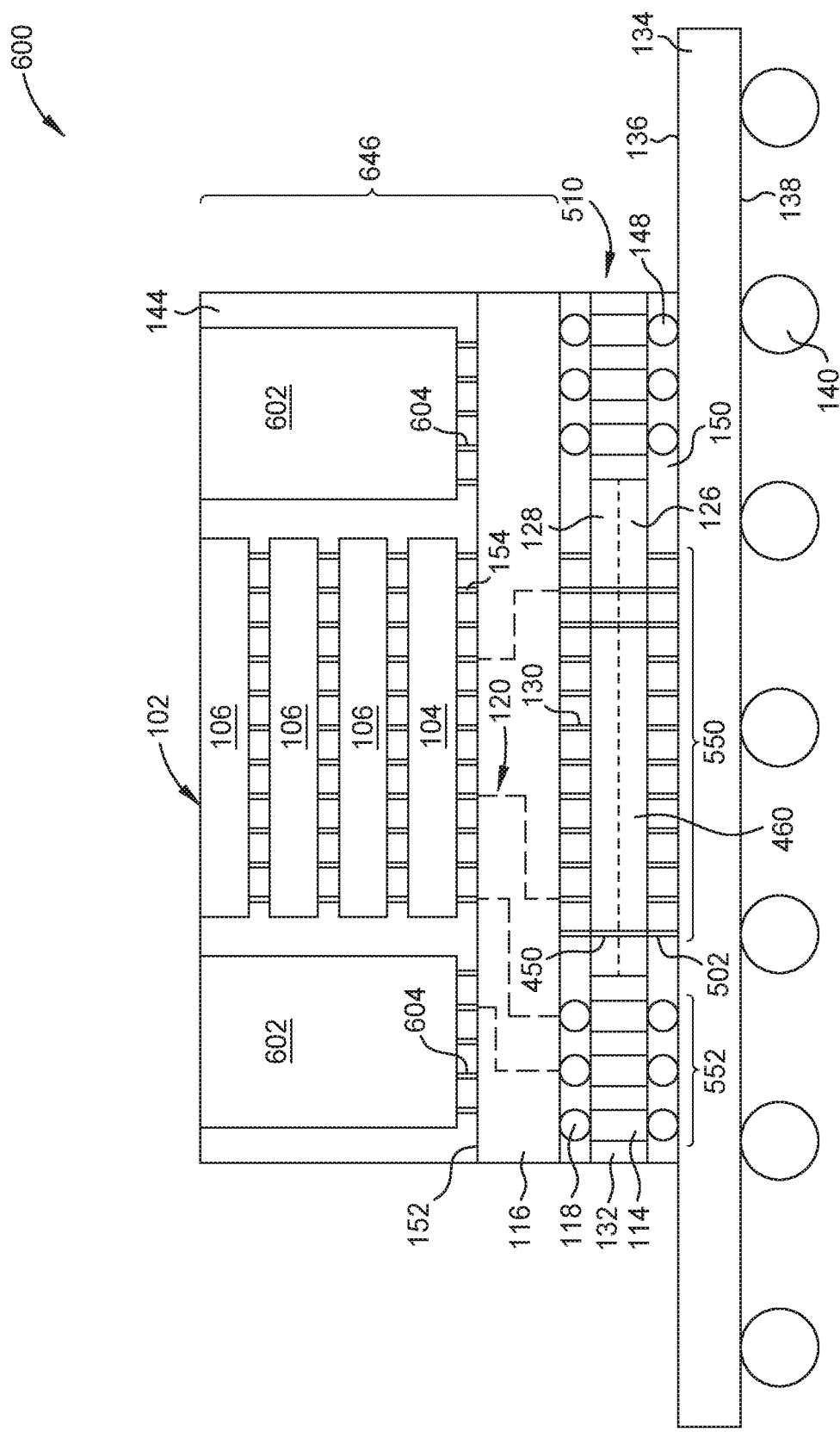
FIG. 6 is a schematic sectional view of another chip package assembly having a chiplet coupled to a chip stack by a redistribution layer of the chip package assembly.

FIG. 6 depicts a schematic sectional view of a chip package assembly 600 having a chip stack 102 coupled to a chiplet 460 by a redistribution layer (RDL) 116. The chip stack 102 and the redistribution layer RDL 116 are configured as described above, forming a chip stack/RDL assembly 646. The chip stack/RDL assembly 646 is mounted to a chiplet layer 510, that includes the chiplet 460. The chiplet layer 510 is fabricated as described above with reference to FIG. 5.

The chip stack/RDL assembly 646 is essentially the same as the chip stack/RDL assembly 146 described above with reference to FIG. 1, except wherein the chip stack/RDL assembly 646 includes at least one auxiliary element 602 disposed in the mold compound 144 of the chip stack/RDL assembly 646. The auxiliary element 602 may provide additional functionality, enhance the performance, or inhibit warpage of the chip package assembly 600.

Alternatively, one or more or all of the auxiliary elements 602 may be coupled to the RDL 116 without being embedded in the mold compound 144. This is, the auxiliary element 602 is outward of the mold compound 144 which allows the auxiliary element 602 to be coupled to the RDL 116 at different of stages of the assembly method as desired.

The example depicted in FIG. 6, two auxiliary elements 602 are illustrated encapsulated in the mold compound 144. It is contemplated that from one to as many auxiliary elements 602 that can fit within the mold compound 144 may be utilized in the chip package assembly 600. The top of the auxiliary elements 602 may be ground or otherwise made coplanar with a top surface of the mold compound 144 and the exposed top surface of the uppermost functional IC die 106. Alternatively, the top of one or more of the auxiliary elements 602 may not be coplanar with the top of the chip stack 102, and/or with one or more of the other auxiliary elements 602. The auxiliary elements 602 are coupled to the RDL 116 via interconnects 604. The interconnects 604 may be solderless hybrid bonding and/or solder connections solder and/or other type of bonding material, such as epoxy. In some examples, the interconnects 604 simply mechanically secure the auxiliary elements 602 to the RDL 116. In other examples, the interconnects 604 provide both electrical and mechanical connection of circuitry within auxiliary elements 602 to the circuitry 120 of the RDL 116.

In one example, at least one or more of the auxiliary elements 602 is a dummy die. The dummy dies are distributed within the mold compound 144 in an arrangement that reduces stress due to temperature changes and mismatches between the coefficient of thermal expansion between the components stacked within the chip package assembly 600.

In another example, at least one or more of the auxiliary elements 602 is a capacitor. An auxiliary element 602 configured as a capacitor, such as a deep trench capacitor, may be utilized with auxiliary elements 602 having other types of configurations. The circuitry of the capacitor formed in the auxiliary element 602 is electrical and mechanical coupled by the interconnects 604 to the circuitry 120 of the RDL 116. In one example, the deep trench capacitor circuitry of the auxiliary elements 602 are coupled to the power rails of the circuitry 120 of the RDL 116.

In another example, at least one or more of the auxiliary elements 602 is an inductor. An auxiliary element 602 configured as a inductor may be utilized with auxiliary elements 602 having other types of configurations. The circuitry of the inductor formed in the auxiliary element 602 is electrical and mechanical coupled by the interconnects 604 to the circuitry 120 of the RDL 116.

In another example, at least one or more of the auxiliary elements 602 is a chiplet. An auxiliary element 602 configured as a chiplet may be utilized with auxiliary elements 602 having other types of configurations. The circuitry of the chiplet formed in the auxiliary element 602 is electrical and mechanical coupled by the interconnects 604 to the circuitry 120 of the RDL 116. The chiplet circuitry of the auxiliary element 602 may be configured as one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, and power regulation/distribution system, or an optical to electrical converter, among others.

Figure 7:
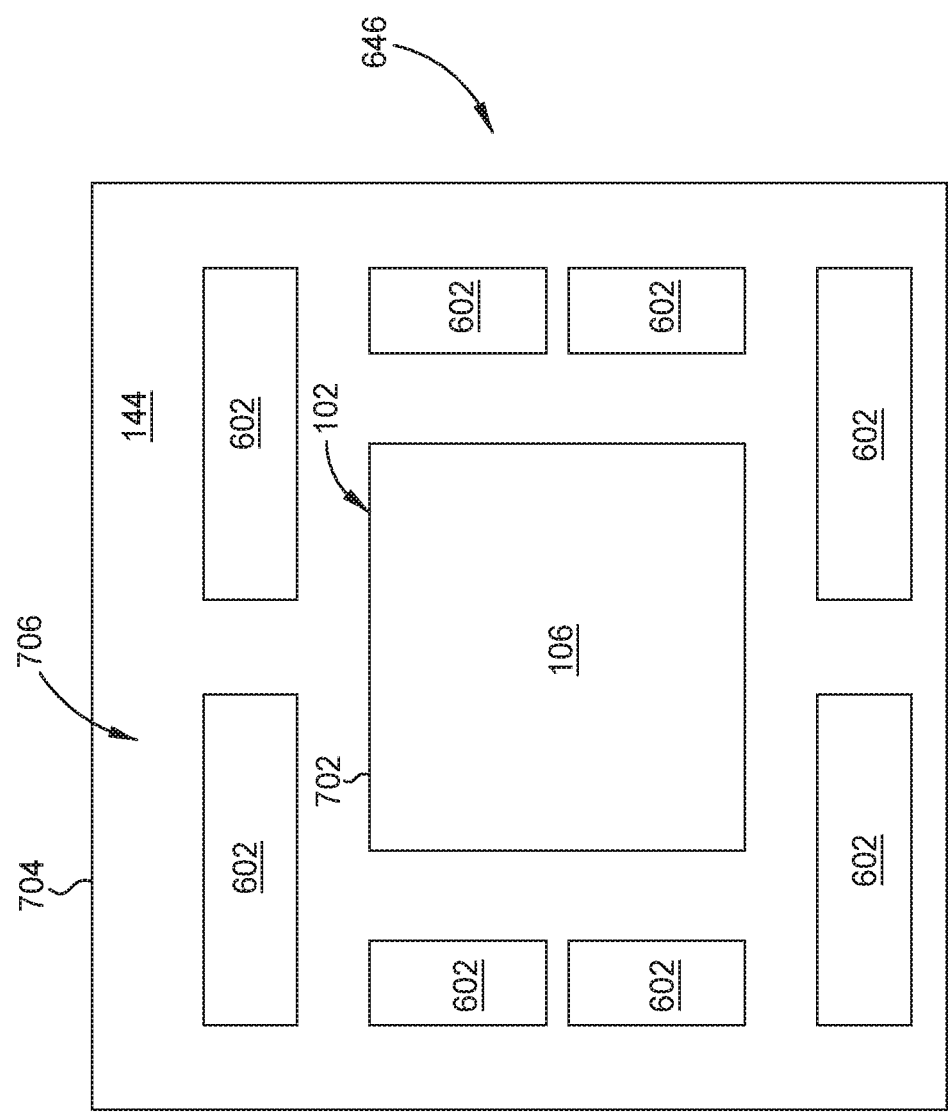
FIG. 7 is a schematic top view of the chip package assembly of FIG. 6 revealing an exemplary geometric arrangement of auxiliary elements disposed around the chip stack.

FIG. 7 is a schematic top view of the chip package assembly 600 of FIG. 6 revealing an exemplary geometric arrangement of auxiliary elements 602 disposed around the chip stack 102. The auxiliary elements 602 are generally disposed in a region 706 the mold compound 144 defined between an outermost edge 702 of the chip stack 102 and an outermost edge 704 of the mold compound 144. The region 706 generally circumscribes the chip stack 102.

In one example, as single auxiliary element 602 is disposed in the region 706 between two adjacent edges 702, 704. In other examples, a plurality of auxiliary elements 602 are disposed in the region 706 between two adjacent edges 702, 704. Two or more auxiliary elements 602 may be disposed in the region 706 in an arrangement that at least two auxiliary elements 602 are separated by the chip stack 102. In other examples, one or more auxiliary elements 602 are disposed in the region 706 between each pair of adjacent edges 702, 704 circumscribing the chip stack 102. In the example depicted in FIG. 7, four auxiliary elements 602 overlap the intersection of two adjacent edges 702 of the chip stack 102, such further enhances the resistance of the chip package assembly 600 to warpage. The auxiliary elements 602 may also have a plan area that is much less than the plan area of the functional IC die 106 of the chip stack 102. The auxiliary elements 602 may also have a length to width aspect ratio that is much greater than the length to width aspect ratio of the functional IC die 106 of the chip stack 102. The high aspect ratio of the auxiliary elements 602 not only fit more efficiently between the adjacent edges 702, 704, but also contribute to stiffening the chip package assembly 600.

Although the auxiliary elements 602 are illustrated as incorporated in a chip package assembly 600 having a construction similar to the chip package assembly 500, one or more auxiliary elements 602 as described above may be incorporated in the mold compound 144 of any of the chip package assemblies described herein, among other chip package assemblies that utilize mold compound circumscribing one or more IC dies.

Figure 8:
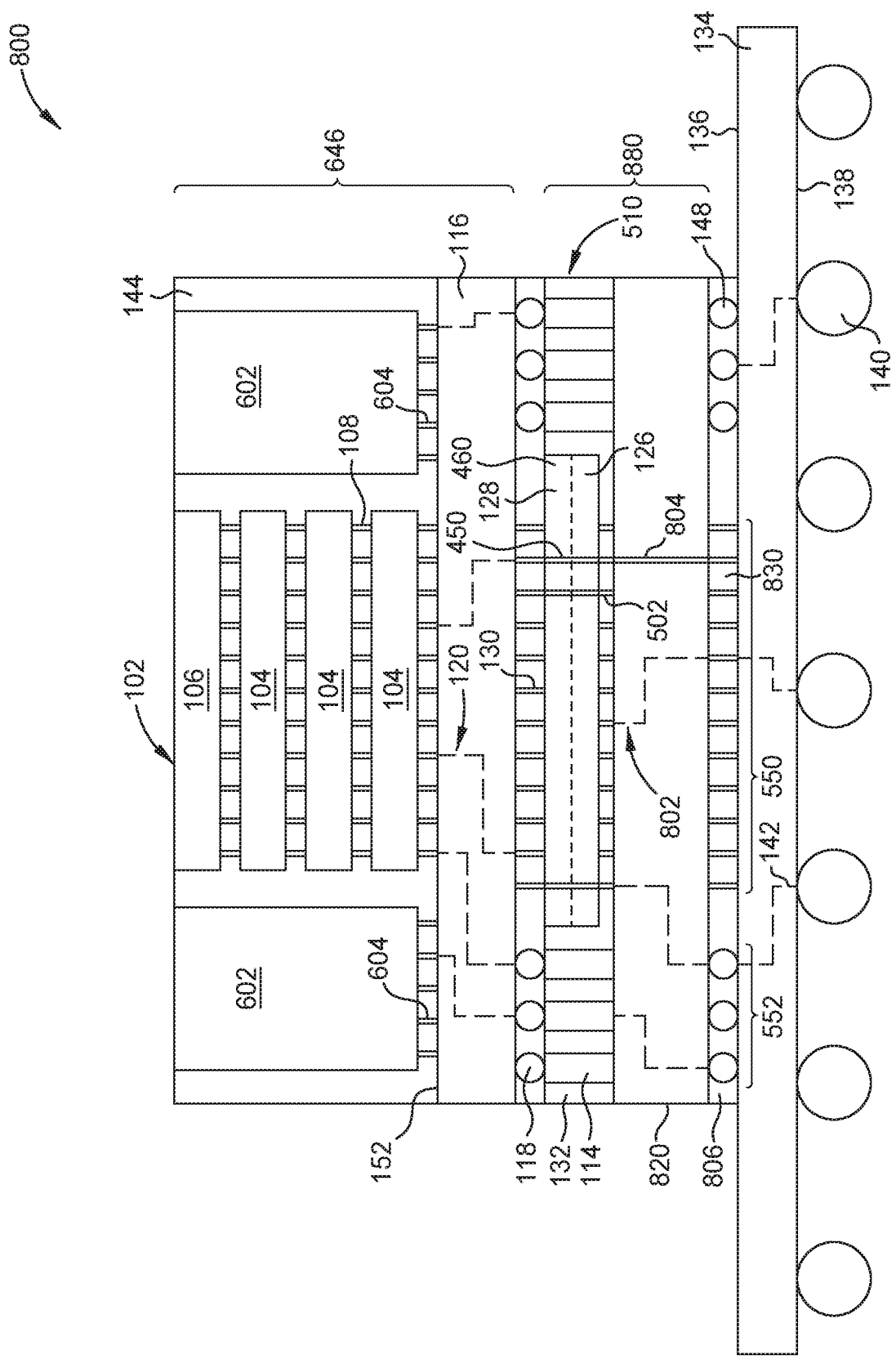
FIG. 8 is a schematic sectional view of yet another chip package assembly having a chiplet coupled to a chip stack by a redistribution layer of the chip package assembly.

FIG. 8 is a schematic sectional view of yet another chip package assembly 800 having a chiplet 460 coupled to a chip stack 102 by a first redistribution layer (RDL) 116 of the chip package assembly 800. 102. The chip stack 102 and the first RDL 116 are configured as described above with reference to FIGS. 1, 2 and 6, forming a chip stack/RDL assembly 646. The chip stack/RDL assembly 646 is mounted to a chiplet layer/RDL assembly 800. The chiplet layer/RDL assembly 800 includes a second RDL 830 is formed directly on the chiplet layer 510. As the chiplet layer 510 the chiplet 460, a portion of the second RDL 830 is formed directly on the chiplet 460. The chiplet layer 510 may be fabricated as described above with reference to FIG. 5.

The chip stack/RDL assembly 646 is essentially the same as the chip stack/RDL assembly described above with reference to FIG. 6. The auxiliary element 602 may provide additional functionality, enhance the performance, or inhibit warpage of the chip package assembly 600.

The chip package assembly 800 may be fabricated as described in FIG. 6 with reference to the chip package assembly 600, except that the chiplet layer 510 is coupled to a package substrate 134 via a second redistribution layer (RDL) 820. The second RDL 830 is fabricated as described in FIG. 2 with reference to the RDL 116, forming circuitry 802 that electronically couples the circuitry of the chiplet layer 510 (i.e., the circuitry of the chiplet 460 and the feed throughs 114) to the package substrate circuitry 142 of the package substrate 134.

The circuitry 802 of the second RDL 830 may optionally include conductive vias 804 extending linearly through the second RDL 830. Such conductive vias 804 may be configured to route power and/or ground directly through the second RDL 830. Additionally, the conductive vias 804 may be vertically aligned with conductive vias 450 formed in the chiplet 460 so that power and/or ground may be routed directly through the second RDL 830 and the chiplet 460 to the first RDL 116.

A portion of the circuitry 802 of the second RDL 830 is coupled directly to the conductive feed throughs 114 of the chiplet layer 510. A portion of the circuitry 802 of the second RDL 830 is coupled directly to the circuitry of the chiplet 460 by interconnects 502, which may be either solderless hybrid bonding and/or solder connections. A portion of the circuitry 802 of the second RDL 830 is coupled directly to the package substrate circuitry 142 of the package substrates by interconnects 830, which also may be either solderless hybrid bonding and/or solder connections. A portion of the circuitry 802 of the second RDL 830 is coupled directly to the package substrate circuitry 142 of the package substrate 134 by interconnects 148, such as solder bumps. The interstitial space between the package substrate 134 and the second RDL 830 interconnects 830 maybe filled with an underfill 806 to protect the interconnects 148, 830 and to stiffen the chip package assembly 800.

Thus, a chip package assembly and method for fabricating have been described that utilizes a modular chip stack that can be matched with one or more chiplets. Advantageously, as chip stack is built upon a simple I/O IC die, a great variety of functional dies may be utilized while maintaining the same output interface of the chip stack through the I/O IC die, which enables a modular and flexible design that can be rapidly designed and developed at minimal cost and time. Moreover, the use chiplets enables the scalable and modular chip stack to be utilized in a large variety of different chiplets, further enhancing the flexibility to design and develop a vast array of chip package assembly designs rapidly and at fraction of the cost and time needed to develop conventional designs. Thus, modular chip package assembly provides excellent scalability, low development costs and very attractive development times.

In addition to the claims below, the disclosed technology may be described in the following non-limiting examples.

Example 1. A chip package assembly including: an input/output integrated circuit (I/O IC) die having a first surface and a second surface; a functional IC die stacked on the first surface of the I/O IC die; a first chiplet having circuitry coupled to the circuitry of the I/O IC die; and a substrate having a first surface and a second surface, the first chiplet disposed between the substrate and the I/O IC die, the substrate having substrate circuitry commutatively coupled within the chip package assembly to functional circuitry of the functional IC die through the first chiplet and the I/O IC die.

Example 2. The chip package assembly of example 1 further including a first redistribution layer (RDL) coupling the second surface of the I/O IC die to the first chiplet.

Example 3. The chip package assembly of example 2 further including circuitry directly connecting I/O circuitry of the I/O IC die to the substrate circuitry while bypassing the first chiplet.

Example 4. The chip package assembly of example 3 further including a first dielectric filler layer disposed laterally around the first chiplet; and conductive vias disposed in the first dielectric filler layer providing electrical connections between the I/O circuitry and the substrate circuitry.

Example 5. The chip package assembly of example 4, wherein the first chiplet further includes solder connections mechanically and electrically coupling the first chiplet to the substrate.

Example 6. The chip package assembly of example 2 further including a second RDL coupling the substrate to an active side of the first chiplet.

Example 7. The chip package assembly of example 6, wherein the first chiplet further includes conductive vias disposed through a first chiplet substrate of the first chiplet, the conductive vias coupling circuitry of the first chiplet to the first RDL.

Example 8. The chip package assembly of example 2, wherein the first chiplet further includes conductive vias disposed through a first chiplet substrate of the first chiplet, the conductive vias coupling circuitry of the first chiplet to first RDL circuitry of the first RDL and the substrate circuitry of the substrate.

Example 9. The chip package assembly of example 4 further including a second dielectric filler layer disposed laterally around the I/O IC die and the functional IC die; and a circuit element disposed in the second dielectric filler layer, the circuit element coupled to first RDL circuitry of the first RDL.

Example 10. The chip package assembly of example 9, wherein the circuit element is a capacitor.

Example 11. The chip package assembly of example 10, wherein the capacitor is a deep trench capacitor coupled to power rails within the first RDL circuitry of the first RDL.

Example 12. The chip package assembly of example 4 further including a second dielectric filler layer disposed laterally around the I/O IC die and the functional IC die; and a second chiplet disposed in the second dielectric filler layer laterally offset from the first chiplet, the second chiplet having second chiplet circuitry coupled to first RDL circuitry of the first RDL.

Example 13. The chip package assembly of example 12, wherein the second chiplet is one of a plurality of chiplets having chiplet circuitry coupled to the first RDL circuitry of the first RDL.

Example 14. The chip package assembly of example 12, wherein the second chiplet circuitry includes one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, and power regulation/distribution system, or an optical to electrical converter.

Example 15. The chip package assembly of example 1, wherein first chiplet does not have through silicon vias.

Example 16. The chip package assembly of example 1, wherein first chiplet circuitry of the first chiplet further includes one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, and power regulation/distribution system, or an optical to electrical converter.

Example 17. The chip package assembly of example 1, wherein the I/O IC die further includes mux and demux circuitry.

Example 18. The chip package assembly of example 1 further including a plurality of IC dies stacked on the first IC die, wherein a second IC die of the plurality of IC dies disposed furthest from the first IC die is a processor.

Example 19. A chip package assembly including: an input/output integrated circuit (I/O IC) die having a first surface and a second surface; a plurality of functional integrated circuit (IC) dies stacked on the first surface of the I/O IC die; a first chiplet; a first redistribution layer (RDL) coupling the second surface of the I/O IC die to the first chiplet; a substrate having a first surface and a second surface, the first chiplet disposed between the substrate and the I/O IC die, the substrate having substrate circuitry commutatively coupled within the chip package assembly to functional circuitry of the functional IC dies through the first RDL, the first chiplet and the I/O IC die; circuitry directly connecting I/O circuitry of the I/O IC die to the substrate circuitry while bypassing the first chiplet; and a dielectric filler layer disposed laterally around the I/O IC die and the functional IC dies.

Example 20. The chip package assembly of example 19 further including a circuit element or a second chiplet disposed in the dielectric filler layer laterally offset from the first chiplet, the circuit element coupled to the first RDL circuitry of the first RDL.

Example 21. The chip package assembly of example 19, wherein first chiplet circuitry of the first chiplet further comprise one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, and power regulation/distribution system, or an optical to electrical converter.

Example 22. The chip package assembly of example 19, wherein the first chiplet has a smaller plan area than the I/O IC die.

Example 23. The chip package assembly of example 19, wherein first chiplet does not have through silicon vias.

Example 24. The chip package assembly of example 19, wherein the I/O IC die further includes mux and demux circuitry.

Example 25. The chip package assembly of example 19, wherein an IC die of the plurality of IC dies disposed furthest from the I/O IC die is a processor.

Example 26. The chip package assembly of example 19, wherein the first chiplet further includes solder connections mechanically and electrically coupling the first chiplet to the substrate.

Example 27. The chip package assembly of example 19 further including a second RDL coupling the substrate to an active side of the first chiplet.

Example 28. The chip package assembly of example 27, wherein the first chiplet further includes conductive vias disposed through a first chiplet substrate of the first chiplet, the conductive vias coupling circuitry of the first chiplet to the first RDL.

Example 29. The chip package assembly of example 19, wherein the first chiplet further includes conductive vias disposed through a first chiplet substrate of the first chiplet, the conductive vias coupling circuitry of the first chiplet to first RDL circuitry of the first RDL and the substrate circuitry of the substrate.

Example 30. A method for fabricating a chip package assembly, the method including: forming a die stack including a plurality of integrated circuit (IC) dies and an I/O IC die, the I/O IC die having exposed contacts; forming a first redistribution layer (RDL) on the exposed contacts of the I/O IC die; coupling a chiplet to the first RDL; and coupling the chiplet to a substrate.

Example 31. The method of example 30 further including forming a second RDL on a side of the chiplet opposite the first RDL.

Example 32. The method of example 30 further including electrically connecting the first RDL to the I/O IC die while bypassing circuitry of the chiplet.

Example 33. The method of example 30 further including forming a first dielectric filler layer around the I/O IC die.

Example 34. The method of example 33 further including electrically coupling a circuit element disposed in the first dielectric filler layer laterally outward of the I/O IC die to the first RDL.

Example 35. The method of example 33 further including electrically coupling a second chiplet disposed in the first dielectric filler layer laterally outward of the I/O IC die to the first RDL.

While the foregoing is directed to embodiments of the present invention, other and further embodiments of the invention may be devised without departing from the basic scope thereof, and the scope thereof is determined by the claims that follow.

What is claimed is:

1. A chip package assembly comprising:
an input/output integrated circuit (I/O IC) die having a first surface and a second surface;
a functional IC die stacked on the first surface of the I/O IC die;
a first chiplet having circuitry coupled to the circuitry of the I/O IC die; and
a substrate having a first surface and a second surface, the first chiplet disposed between the substrate and the I/O IC die, the substrate having substrate circuitry commutatively coupled within the chip package assembly to functional circuitry of the functional IC die through the first chiplet and the I/O IC die.

2. The chip package assembly of claim 1 further comprising:
a first redistribution layer (RDL) coupling the second surface of the I/O IC die to the first chiplet.

3. The chip package assembly of claim 2 further comprising:
circuitry directly connecting I/O circuitry of the I/O IC die to the substrate circuitry while bypassing the first chiplet.

4. The chip package assembly of claim 3 further comprising:
a first dielectric filler layer disposed laterally around the first chiplet; and
conductive vias disposed in the first dielectric filler layer providing electrical connections between the I/O circuitry and the substrate circuitry.

5. The chip package assembly of claim 4, wherein the first chiplet further comprises:
solder connections mechanically and electrically coupling the first chiplet to the substrate.

6. The chip package assembly of claim 2 further comprising:
a second RDL coupling the substrate to an active side of the first chiplet.

7. The chip package assembly of claim 6, wherein the first chiplet further comprises:
conductive vias disposed through the first chiplet, the conductive vias coupling circuitry of the first chiplet to the first RDL.

8. The chip package assembly of claim 2, wherein the first chiplet further comprises:
conductive vias disposed through the first chiplet, the conductive vias coupling circuitry of the first chiplet to first RDL circuitry of the first RDL and the substrate circuitry of the substrate.

9. The chip package assembly of claim 4 further comprising:
a second dielectric filler layer disposed laterally around the I/O IC die and the functional IC die; and
an auxiliary element disposed in the second dielectric filler layer, the auxiliary element coupled to first RDL circuitry of the first RDL, wherein the auxiliary element is a capacitor, a dummy structure or a chiplet.

10. The chip package assembly of claim 4 further comprising:
a second dielectric filler layer disposed laterally around the I/O IC die and the functional IC die; and
a second chiplet disposed in the second dielectric filler layer laterally offset from the first chiplet, the second chiplet having second chiplet circuitry coupled to first RDL circuitry of the first RDL.

11. The chip package assembly of claim 10, wherein the second chiplet is one of a plurality of chiplets having chiplet circuitry coupled to the first RDL circuitry of the first RDL.

12. The chip package assembly of claim 11, wherein the second chiplet circuitry comprises one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, high bandwidth memory, and power regulation/distribution system, or an optical to electrical converter.

13. The chip package assembly of claim 1, wherein first chiplet does not have through silicon vias.

14. The chip package assembly of claim 1, wherein first chiplet circuitry of the first chiplet further comprises one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, high bandwidth memory, and power regulation/distribution system, or an optical to electrical converter.

15. The chip package assembly of claim 1, wherein the I/O IC die further comprises:
mux and demux circuitry.

16. The chip package assembly of claim 1 further comprising:
a plurality of IC dies stacked on the functional IC die, wherein an uppermost IC die of the plurality of IC dies is a processor, the uppermost IC die being disposed furthest from the functional IC die than each remaining IC die of the plurality of IC dies.

17. A chip package assembly comprising:
an input/output integrated circuit (I/O IC) die having a first surface and a second surface;
a plurality of functional integrated circuit (IC) dies stacked on the first surface of the I/O IC die;
a first chiplet;
a first redistribution layer (RDL) coupling the second surface of the I/O IC die to the first chiplet;
a substrate having a first surface and a second surface, the first chiplet disposed between the substrate and the I/O IC die, the substrate having substrate circuitry commutatively coupled within the chip package assembly to functional circuitry of the functional IC dies through the first RDL, the first chiplet and the I/O IC die;
circuitry directly connecting I/O circuitry of the I/O IC die to the substrate circuitry while bypassing the first chiplet; and
a dielectric filler layer disposed laterally around the I/O IC die and the functional IC dies.

18. The chip package assembly of claim 17, wherein first chiplet circuitry of the first chiplet further comprise one or more of physical layer (PHY) circuitry, high-bandwidth memory circuitry, processor, a serial deserializer (SerDes), a high speed serial bus, an analog to digital converter, a digital-to-analog converter, video-codec circuitry, an electrical to optical converter, memory subsystem, processor sub-system, flash memory, high bandwidth memory, and power regulation/distribution system, or an optical to electrical converter.

19. The chip package assembly of claim 17 further comprising:
a second RDL coupling the substrate to an active side of the first chiplet.

20. The chip package assembly of claim 17, wherein the first chiplet further comprises:
conductive vias disposed through the first chiplet, the conductive vias coupling circuitry of the first chiplet to first RDL circuitry of the first RDL and the substrate circuitry of the substrate.

* * * * *